United States Patent
Djemour et al.

(10) Patent No.: US 11,664,334 B2
(45) Date of Patent: May 30, 2023

(54) SEMICONDUCTOR PACKAGE WITH TEMPORARY ESD PROTECTION ELEMENT

(71) Applicant: Infineon Technologies Austria AG, Villach (AT)

(72) Inventors: Rabie Djemour, Munich (DE); Muhammad Khairullah Nor Azmi, Kedah (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/199,546

(22) Filed: Mar. 12, 2021

(65) Prior Publication Data

US 2022/0293535 A1    Sep. 15, 2022

(51) Int. Cl.
*H01L 23/60* (2006.01)
*H01H 71/02* (2006.01)
*H01H 71/12* (2006.01)

(52) U.S. Cl.
CPC ......... *H01L 23/60* (2013.01); *H01H 71/0228* (2013.01); *H01H 71/122* (2013.01)

(58) Field of Classification Search
CPC .... H01L 23/60; H01H 71/0028; H01H 1/122; H01H 71/0228
See application file for complete search history.

(56) References Cited

U.S. PATENT DOCUMENTS

| | | | |
|---|---|---|---|
| 6,653,672 B1* | 11/2003 | Zheng | H01L 23/50 257/E23.079 |
| 7,943,424 B1* | 5/2011 | Wang | H01L 21/4842 438/123 |
| 8,368,192 B1 | 2/2013 | Chen | |
| 9,559,007 B1* | 1/2017 | Truhitte | H01L 24/96 |
| 10,388,594 B2* | 8/2019 | Gomez | H01L 23/4952 |
| 2001/0017755 A1* | 8/2001 | Toyoshima | H01L 27/0255 361/91.5 |
| 2001/0050424 A1 | 12/2001 | Lee | |
| 2005/0275070 A1 | 12/2005 | Hollingsworth | |
| 2017/0221804 A1* | 8/2017 | Taguchi | H01L 23/49517 |
| 2017/0250172 A1* | 8/2017 | Huang | H01L 23/60 |
| 2019/0355643 A1* | 11/2019 | Hong | H01L 23/49805 |

FOREIGN PATENT DOCUMENTS

JP    S5913354 A    1/1984

* cited by examiner

*Primary Examiner* — Scott Bauer
(74) *Attorney, Agent, or Firm* — Murphy, Bilak & Homiller, PLLC

(57) ABSTRACT

A semiconductor device includes a semiconductor package including an encapsulant body of electrically insulating encapsulant material, a semiconductor die encapsulated by the encapsulant body, and two or more leads that are each electrically connected to the semiconductor die, and an ESD protection element that is electrically connected between the two or more leads, and the ESD protection element is configured to be electrically disconnected from the two or more leads by an external stimulus applied to ESD protection element that is non-destructive to the semiconductor package.

20 Claims, 7 Drawing Sheets

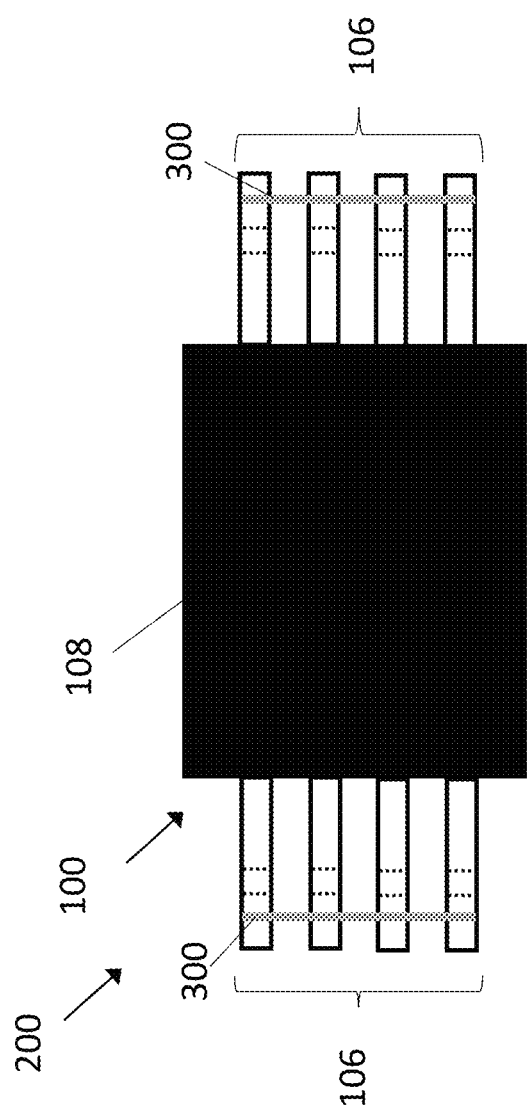
FIGURE 2

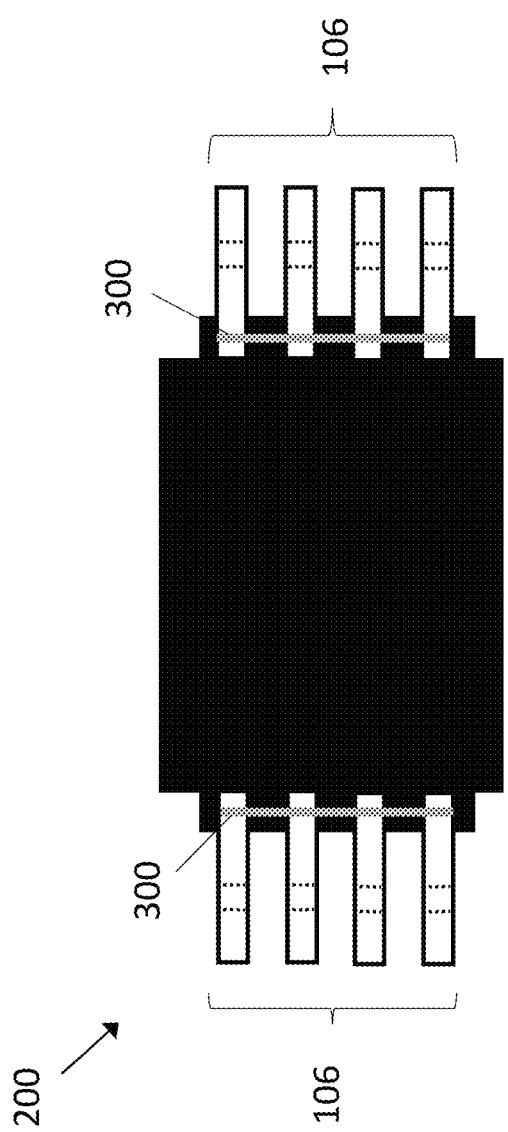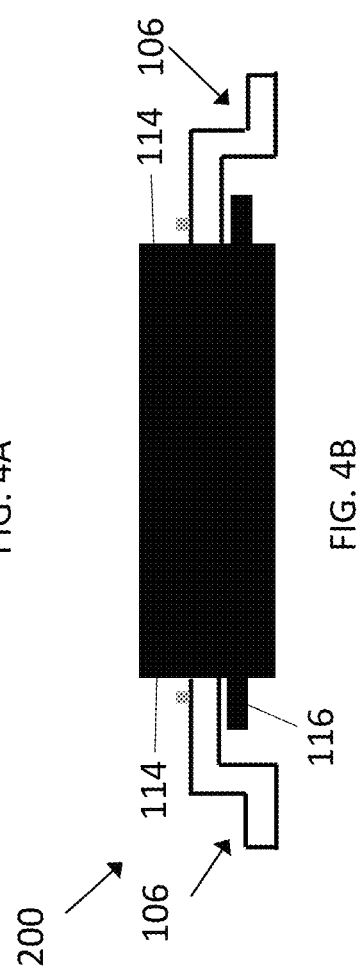
FIGURE 4

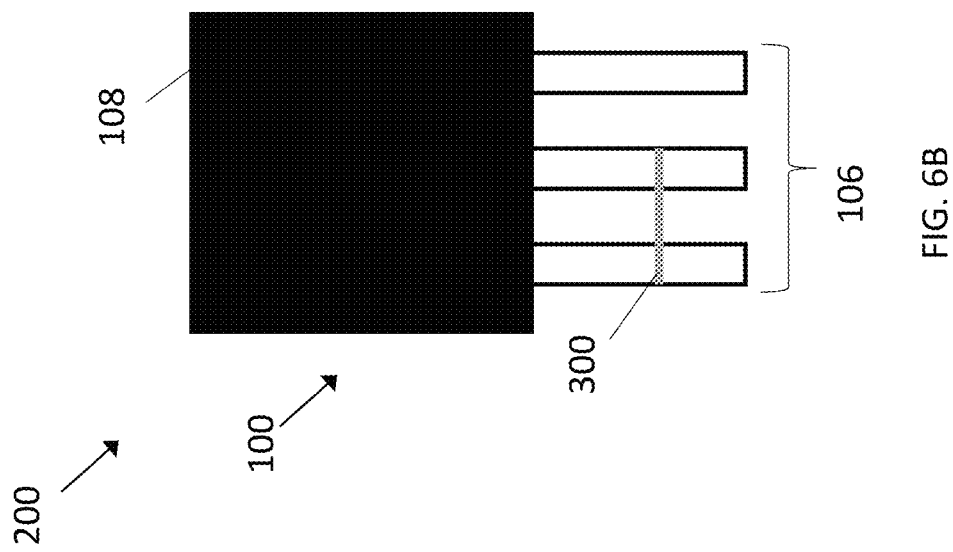
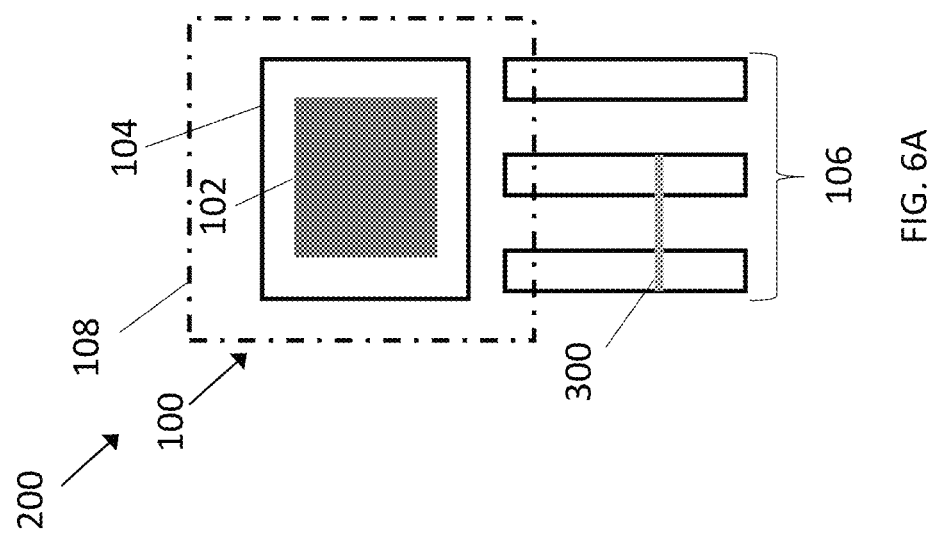
FIGURE 6

US 11,664,334 B2

SEMICONDUCTOR PACKAGE WITH TEMPORARY ESD PROTECTION ELEMENT

BACKGROUND

Semiconductor devices are susceptible to damage from an electrostatic discharge (ESD) event wherein a sudden flow of electricity occurs between two electrically charged objects. Measures may be taken during the manufacture of a semiconductor device to protect a semiconductor device from damaging ESD events. However, subsequent handling and processing of a semiconductor device that occurs after manufacture is complete may cause potentially damaging ESD events. For example, when a packaged semiconductor device is mounted on a circuit carrier such as a printed circuit board (PCB), the movement and handling of the semiconductor device can cause a buildup of static electricity, which in turn may result in an ESD events that destroys the device. Moreover, built-in circuit features such as ESD protection diodes may be ineffective at protecting from these ESD events, or it may not be cost-effective to provide these circuit features at every circuit node that is vulnerable to ESD events. It is therefore desirable to protect semiconductor devices from electrostatic discharge in a cost-effective manner.

SUMMARY

A semiconductor device comprises a semiconductor package comprising an encapsulant body of electrically insulating encapsulant material, a semiconductor die encapsulated by the encapsulant body, and two or more leads that are each electrically connected to the semiconductor die, and an ESD protection element that is electrically connected between the two or more leads, and wherein the ESD protection element is configured theory it could also by internal but to be electrically disconnected from the two or more leads by an external stimulus applied to ESD protection element that is non-destructive to the semiconductor package.

Separately or in combination, the ESD protection element is an electrical resistance or capacitance between at least two of the leads.

Separately or in combination, the external stimulus comprises any one or more of the following: externally applied heat to the semiconductor device, externally applied voltage to the two or more leads, externally applied mechanical force to the ESD protection element, and externally applied solvent to the ESD protection element.

Separately or in combination, the ESD protection element is external to the encapsulant body.

Separately or in combination, the two or more leads comprise outer ends that are exposed from the encapsulant body, and the ESD protection element is a wire that is attached to the outer ends of the two or more leads.

Separately or in combination, the external stimulus comprises a chemical solvent, and the ESD protection element is configured to be electrically disconnected from the two or more leads by dissolving the ESD protection element in the chemical solvent.

Separately or in combination, the ESD protection element comprises a solder material, the external stimulus comprises externally applied heat, and the ESD protection element is configured to be electrically disconnected from the two or more leads by heating the ESD protection element above a reflow temperature of the solder material.

Separately or in combination, the encapsulant body comprises an outer sidewall extending between upper and lower surfaces of the encapsulant body, and a shelf of the encapsulant material that extends transversely to the outer sidewall, and the ESD protection element is disposed directly over the shelf.

Separately or in combination, the external stimulus comprises externally applied mechanical force to the ESD protection element, and wherein the ESD protection element is configured to mechanically break or detach from the two or more leads in the presence of the externally applied mechanical force.

Separately or in combination, the ESD protection element is internal to the encapsulant body.

Separately or in combination, the external stimulus comprises an externally applied current through the two or more leads, and the ESD protection element comprises an electrical fuse that is configured to self-destruct under the externally applied current.

Separately or in combination, the semiconductor die comprises a power transistor, and a first one of the two or more leads comprise a gate terminal of the power transistor and a second one of the two or more leads comprise an output terminal of the power transistor.

According to another embodiment, the semiconductor device comprises an encapsulant body of electrically insulating encapsulant material, a semiconductor die encapsulated by the encapsulant body and comprising first and second terminals, and an ESD protection element connected to the first and second terminals, the ESD protection element is configured to divert electrical current away from the first and second terminals in an ESD event, and the ESD protection element is removable or destructible by an external stimulus that is non-destructive to a remainder of the semiconductor device.

A method of providing a semiconductor device is disclosed. According to an embodiment, the method comprises providing a semiconductor package that comprises an encapsulant body of electrically insulating encapsulant material, a semiconductor die encapsulated by the encapsulant body, two or more leads that are each electrically connected to the semiconductor die, and electrically connecting an ESD protection element between the two or more leads, and the ESD protection element is configured to disconnect from the two or more leads by an external stimulus that is non-destructive to the semiconductor package.

Separately or in combination, the method further comprises providing a circuit carrier, mounting the semiconductor device with the ESD protection element on the circuit carrier, and disconnecting the ESD protection element from the two or more leads by applying the external stimulus before operating the semiconductor die.

Separately or in combination, the external stimulus comprises a chemical solvent, and disconnecting the ESD protection element comprises dissolving the ESD protection element by applying the chemical solvent to the ESD protection element.

Separately or in combination, the ESD protection element comprises a wire of solder material, the external stimulus comprises externally applied heat to the ESD protection element, and disconnecting the ESD protection element comprises applying the heat to the ESD protection element to heat the ESD protection element above a reflow temperature of the solder material.

Separately or in combination, the ESD protection element comprises a wire that is attached to the two or more leads, the encapsulant body comprises an outer sidewall extending between upper and lower surfaces of the encapsulant body and a shelf of the encapsulant material that extends transversely to the outer sidewall, and after applying the external stimulus remnants of the ESD protection element accumulate on the shelf.

Separately or in combination, the ESD protection element is external to the encapsulant body, and disconnecting the ESD protection element comprises applying mechanical force that is non-destructive to the leads to detach the ESD protection element from the two or more leads.

Separately or in combination, the ESD protection element is internal to the encapsulant body and is configured as a fuse, and disconnecting the ESD protection element comprises applying electrical current to the two or more leads that destroys the ESD protection element.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A, 1B and 1C, illustrates a semiconductor package, according to an embodiment. FIG. 1A depicts a plan view of the semiconductor package with an outline of the encapsulant body, FIG. 1B depicts a plan view of the semiconductor package, and FIG. 1C depicts a side view of the semiconductor package.

FIG. 2, which includes FIGS. 2A and 2B, illustrates a semiconductor device that comprises a semiconductor package and an ESD protection device, according to an embodiment. FIG. 2A depicts the device from a plan view, and FIG. 2B depicts the device from a side view.

FIG. 4, which includes FIGS. 4A and 4B, illustrates a semiconductor device that comprises a semiconductor package and an ESD protection device, according to another embodiment. FIG. 4A depicts the semiconductor device from a plan view, and FIG. 4B depicts the semiconductor device from a side view.

FIG. 6, which includes FIGS. 6A and 6B, illustrates a semiconductor device that comprises a semiconductor package and an ESD protection device, according to another embodiment. FIG. 6A depicts a plan view of the semiconductor device with an outline of the encapsulant body, and FIG. 6B depicts a plan view of the semiconductor device.

FIGS. 7A, 7B and 7C, illustrates a semiconductor device that comprises a semiconductor package and an ESD protection device, according to another embodiment. FIG. 7A depicts a plan view of the semiconductor device with an outline of the encapsulant body, FIG. 7B depicts a plan view of the semiconductor device, and FIG. 7C depicts a side view of the semiconductor device.

DETAILED DESCRIPTION

Embodiments of a semiconductor device that comprises a semiconductor package and an ESD protection element are described herein. The ESD protection element is physically connected across at least two leads of the semiconductor package and is configured to protect an encapsulated semiconductor die within the package from an ESD event. The ESD protection element is a temporary structure that can be destroyed, detached, or otherwise rendered inoperable before the device is operated. To this end, the ESD protection element is designed to respond to an external stimulus such as heat, chemical solvent, mechanical force, applied electricity, etc., such that the ESD protection element is disabled without damaging the semiconductor package. The ESD protection element advantageously protects the semiconductor package from a potentially damaging ESD event during the transport, handling and mounting of the semiconductor package. Further, the ESD protection element may provide a cost-effective alternative to dedicated ESD protection circuitry, such as ESD protection diodes.

Figure 1:
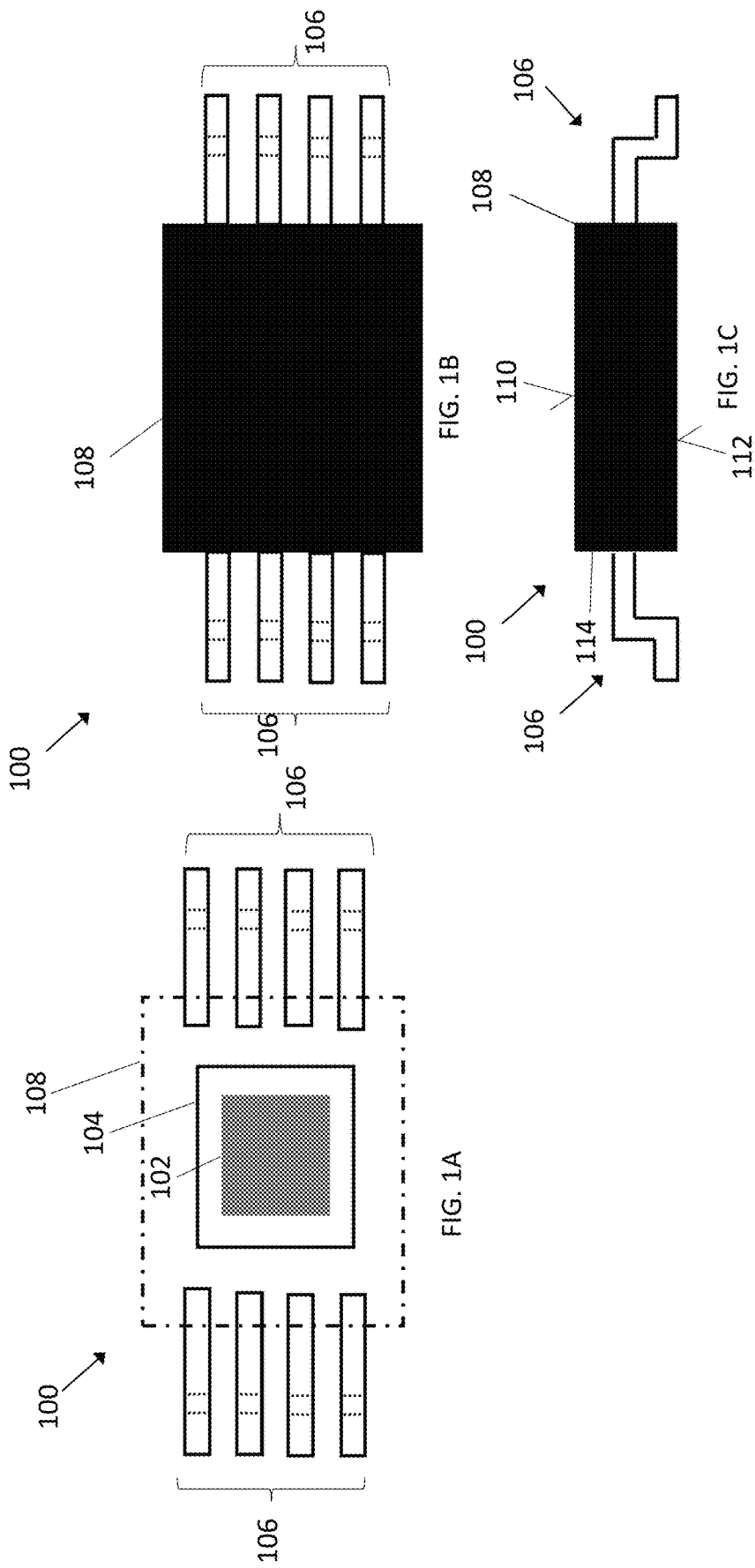
FIG. 1, which includes

Referring to FIG. 1, a semiconductor package 100 is depicted, according to an embodiment. The semiconductor package 100 comprises at least one semiconductor die 102. Generally speaking, the semiconductor die 102 can have a wide variety of device configurations, e.g., a discrete device such as a MOSFET, IGBT, diode, etc., or an integrated circuit such as a controller, driver, etc. The semiconductor die 102 is mounted on a die pad 104 by an adhesive, e.g., solder, sinter, conductive tape, etc. The terminals of the semiconductor die 102, e.g., gate, source, drain, collector, emitter, etc., can be provided by external bond pads (not shown) that are disposed on a main surface of the semiconductor die 102 that faces away from the die pad 104 or on a rear surface of the semiconductor die 102 that faces the die pad 104.

The semiconductor package 100 additionally comprises a plurality of leads 106 that extend away from the die pad 104. The leads 106 are electrically connected to the terminals of the semiconductor die 102 by electrical interconnect elements (not shown) such as bond wires, ribbons, metal clips, etc. In another embodiment (not shown), one or more of the leads 106 merges with the die pad 104, thus enabling a direct electrical connection to a rear surface terminal of the semiconductor die 102. The leads 106 and the die pad 104 can be constituent parts of a lead frame that is formed from an electrically conductive material such as copper, aluminum, nickel, iron, zinc, etc., and alloys thereof.

The semiconductor package 100 additionally comprises an encapsulant body 108 that encapsulates the semiconductor die 102. The encapsulant body 108 comprises an electrically insulating encapsulant material, e.g., mold compound, thermosetting plastic, laminate, etc. The encapsulant body 108 comprises an upper surface 110, a lower surface 112 that is opposite the upper surface 110, and outer sidewalls 114 extending between the upper and lower surfaces 110,112. Outer ends of the leads 106 are exposed from the encapsulant body 108. These exposed ends of the leads 106 provide externally accessible points of electrical contact to the various terminals of the semiconductor die 102.

Referring to FIG. 2, a semiconductor device 200 that comprises the semiconductor package 100 and an ESD protection element 300 is shown, according to an embodiment. In the embodiment of FIG. 2, the ESD protection element 300 is external to the encapsulant body 108. The ESD protection element 300 is electrically connected between at least two of the leads 106. As shown, the connection may be provided by direct physical contact between the ESD protection element 300 and the exposed outer ends of the leads 106.

The ESD protection element 300 is configured to divert electrical current away from two terminals of the semiconductor die (e.g., gate and source) in an ESD event. That is, the ESD protection element is arranged to prevent an ESD event from damaging the semiconductor die by exceeding the rated dielectric strength of the terminals to which the ESD protection element 300 is connected.

Generally speaking, the ESD protection element 300 can be connected across any two or more of the leads 106 in which a sudden voltage difference would cause damage to the semiconductor die 102. According to an embodiment, the semiconductor die 102 is a power transistor, e.g., MOSFET or IGBT, and the ESD protection element 300 is electrically connected between the gate terminal and an output terminal, e.g., the source terminal in a MOSFET or the emitter terminal in an IGBT, of the semiconductor die 102. This arrangement protects the gate dielectric of such a device, which is susceptible to dielectric breakdown by an ESD event.

According to an embodiment, the ESD protection element 300 is configured as an electrical resistance between at least two of the leads 106. This resistance value can be selected to meet certain criteria that protect the semiconductor die 102 from most if not all plausible ESD events. For example, the resistance of the ESD protection element 300 can be made to satisfy an industry standard test with respect to ESD compliance. Examples of these industry standard tests include Joint Electron Tube Engineering Council (JEDEC) standards for the human body model (HBM), the charge device model (CDM), and the machine model (MM). Specifically, JS-001-2017, which is incorporated by reference herein in its entirety, is an industry standard HBM test that intends to simulate the response of a DUT ("device under test") to a sudden current discharge of static electricity from human contact. According to this test, the DUT is connected in series with a 1.5-kΩ resistor and a 100-pF capacitor. The capacitor is charged to a predefined voltage, e.g., 2 kV and subsequently discharged. By providing an electrical resistance between the leads with a resistance value that is sufficiently low, most of the discharge current can be shunted away from the DUT. For example, the ESD protection element 300 can be configured to provide an electrical resistance of 75 ohms between any two of the leads 106. This results in a 1:20 ratio between the resistance of the ESD protection element 300 and the 1.5-kΩ resistor.

According to an embodiment, the ESD protection element 300 is a wire that is physically and electrically connected to the exposed outer ends of the leads 106. The working principle of this configuration is to provide a low-resistance electrical connection between the leads 106 which provides a discharge path for excess current, and to prevent discharge through sensitive elements of the semiconductor device. Stated another way, the wire is used to prevent large voltage build-ups from occurring between the leads 106. The electrical resistance of the wire can be selected, e.g., through material composition and cross-sectional geometry, to satisfy an industry standard test with respect to ESD compliance in a similar manner as described above. Generally speaking, the wire can comprise any conductive material, e.g., copper, aluminum, nickel, alloys, thereof. In an embodiment, the wire comprises a fusible metal alloy such as tin-based solder, lead-based solder, etc. One particular advantage of using fusible metal alloy is that the wire can be easily attached to the leads 106 using a heat-based process. For example, a laser may be used to locally heat the material of the wire, thereby melting and adhering the wire to the leads 106.

Instead of a wire, the ESD protection element 300 may also be another type of low-resistance conductive connector that is electrically connected between at least two of the leads 106. For example, the ESD protection element 300 can comprise a conductive tape that comprises a conductive material, silver, nickel, copper, etc. suspended with a polymer matrix. A strip of this conductive tape can be applied directly onto the leads 106 and secured thereto by the adhesive of the tape. In another example, the ESD protection element 300 may be formed from or comprise an intrinsically conductive polymer (ICP), e.g., polypyrrole, polyaniline, polyacetylenes, polyphenylene vinylene, etc. In another example, the ESD protection element 300 can be comprise conductive spray coating that comprises a conductive material such as copper, silver, aluminum, molybdenum, etc. suspended in a curable liquid. The conductive spray coating can be applied at least in the vicinity of the leads 106 to form a conducive bridge between each lead. The electrical resistance of the conductive tape or conductive spray coating can be selected by tailoring of physical parameters, e.g., material composition, cross-sectional geometry, etc., to satisfy an industry standard test with respect to ESD compliance in a similar manner as described above.

According to another embodiment, the ESD protection element 300 is configured as an electrical capacitance between at least two of the leads 106. The working principle of this configuration is to provide a sufficiently large capacitance between the two of the leads such that the capacitor absorbs most of the discharge current resulting from the ESD event. The capacitance of the capacitor can be selected to meet certain criteria that protect the semiconductor die 102 from most if not all plausible ESD events. More specifically, the capacitance value can be selected to satisfy a standardized test, e.g., any of the above-mentioned JEDEC standards.

Figure 3:
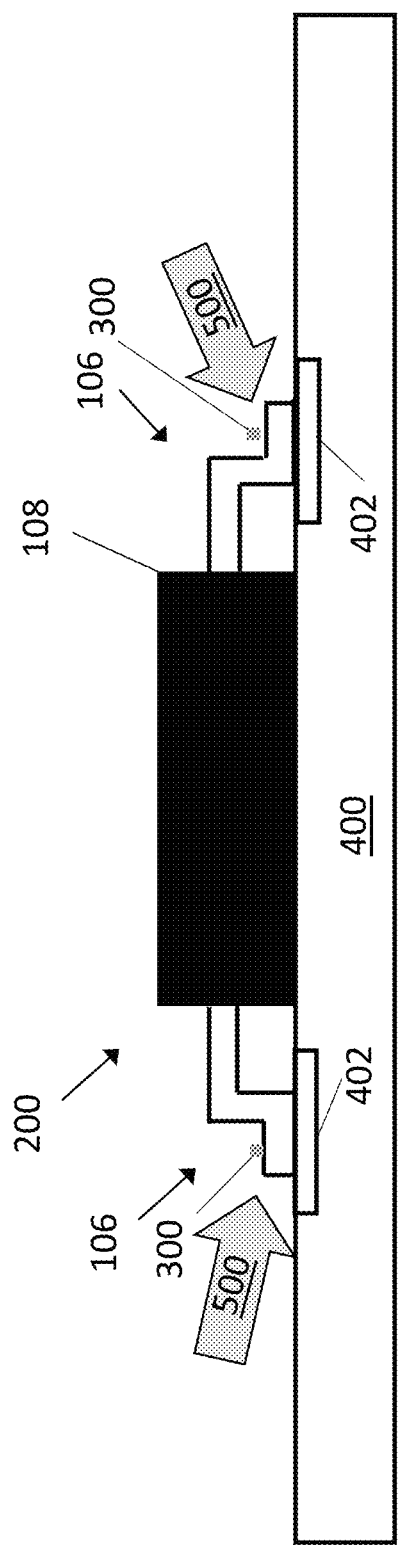
FIG. 3 illustrates a semiconductor device that comprises a semiconductor package and an ESD protection device mounted on a circuit carrier, according to an embodiment.

Referring to FIG. 3, a semiconductor device 200 comprising the ESD protection element 300 is mounted on a circuit carrier 400. The circuit carrier 400 comprises an electrically insulating substrate and multiple bond pads 402 that are electrically conductive and extend to a mounting surface of the circuit carrier 400. The semiconductor package 100 is mounted on the circuit carrier 400 such that the exposed portions of the leads 106 interface and electrically connect with the bond pads 402. A conductive adhesive such as solder, sinter, etc., may be used to form a mechanical and electrical connection between the leads 106 and the bond pads 402. The circuit carrier 400 may additionally comprise integrally formed interconnect structures (e.g., conductive tracks) that form electrical connections between the bond pads 402 associated with the semiconductor package 100 and other devices mounted on the circuit carrier 400 (not shown).

The ESD protection element 300 has structural characteristics that respond to an external stimulus 500 such that the ESD protection element 300 is functionally disabled, meaning that the ESD protection element 300 no longer forms an electrical resistance or capacitance across the leads that protects the semiconductor die 102 in the above-described manner. Thus, the functional life of the ESD protection element 300 begins at the point that the ESD protection element 300 is attached to or incorporated into the semiconductor package 100 and ends when the external stimulus 500 is applied.

The external stimulus 500 can be any form of energy that brings about a physical change in the ESD protection element 300. Examples of the external stimulus 500 include mechanical force, heat, chemical reaction, electrical current, and any combination thereof. The external stimulus 500 is non-destructive to the semiconductor package 100. This means that the material properties of the ESD protection element 300 and/or attachment mechanism between the ESD protection element 300 and the leads 106 are selectively responsive to the external stimulus 500 to bring about the physical change necessary to disconnect the ESD protection element 300 from the leads 106 without causing irreparable damage to all elements of the semiconductor package 100, e.g., the leads 106, the semiconductor die 102, the encapsulant body 108, etc.

According to an embodiment, the ESD protection element 300 is configured to be electrically disconnected from the leads 106 by an external stimulus 500 that comprises externally applied heat to the ESD protection element 300. The externally applied heat is sufficient to disrupt any continuous material connection between the leads 106. According to one technique, the constituent material of the ESD protection is melted (liquified) by the externally applied heat. The ESD protection element 300 along with the semiconductor package 100 can be heated until the melting point of the ESD protection element 300 is reached. In that case, the melting point of the ESD protection element 300 can be lower than that of all elements of the semiconductor package 100 so that the melting process does not cause irreparable damage to the package 100 itself. In another example, a targeted heat technique such as a laser heating is applied to the ESD protection element 300 itself or to the connection points between the ESD protection element 300 and the leads 106. In this case, the heat used to detach or disable the ESD protection element 300 is not uniformly applied to other elements of the semiconductor package 100 and thus does not cause damage.

An example of an ESD protection element 300 that is responsive to a heat stimulus is a wire formed from a low-melting point conductive material. Examples of these materials include so-called wood's metal, which is an alloy of bismuth, tin and cadmium and has a melting point of about 70° C., potassium (K) which has a has a melting point of about 60-70° C., tin (Sn) which has a has a melting point of about 230-240° C., solder materials such as tin-based solder or lead-based solder, which have a melting point of typically about 350° C.-500° C. In each case, the material of the wire itself can easily be melted without substantially damaging the semiconductor package 100.

According to one technique, the same heat-based process that is used to mount the semiconductor package 100 on the carrier is also used to disconnect the ESD protection element 300. That is, the mounting process and the disabling of the ESD protection element 300 are performed by a single heating step. As mentioned above, the semiconductor package 100 can be mounted on the carrier by soldering the leads 106 to the bond pads 402. During this process, the assembly is heated to a reflow temperature of the solder material used to secure the leads 106 to the bond pads 402. The ESD protection element 300 may be formed from the same solder material that is used to secure the leads 106 or from another low-melting point conductive material which has a melting point equal to or lower than the reflow temperature. As a result, the ESD protection element 300 will melt concurrently with the solder that is used to secure the leads 106. The melted remnants of the wire may accumulate on the carrier 402 below the leads 106. These remnants can be subsequently by cleaning solvents such as propylene and/or ether containing solvents. Additionally, or alternatively, these remnants may be rendered inert by regions of solder resistant material provided on the carrier 402 at the appropriate location beneath the leads 106. Particularly if the volume of material from the wire is sufficiently low, a separate cleaning step may not be necessary. For example, the above-described laser attachment technique allows for the provision and attachment of an ESD protection element 300 that is configured as a wire with sufficiently low material volume so that separate cleaning is not necessary.

According to another embodiment, the ESD protection element 300 is configured to be electrically disconnected from the leads 106 by an external stimulus 500 that comprises externally applied chemical solvent (e.g., aqueous solvent) to the ESD protection element 300. In that case, the material properties of the ESD protection element 300 are selected to induce a chemical reaction with the solvent that disrupt any continuous material connection between the leads 106 while simultaneously not substantially react with the exposed leads 106 or surfaces of the encapsulant body 108. For example, the ESD protection element 300 can be configured as a wire, such as a solder-based wire according to the above examples. This type of wire can be dissolved by standard solder cleaning chemicals such as alcohol-based flux removers. Moreover, these solder cleaning chemicals are typically non-abrasive to the conductive metals and mold-compound materials of the semiconductor package 100. In another example, the ESD protection element 300 can be configured as a conductive spray coating around the outside of the semiconductor package 100 and removed by a chemical solvent.

According to an embodiment, the ESD protection element 300 is configured to be electrically disconnected from the leads 106 by an externally applied mechanical force to the ESD protection element 300. In this configuration, the material properties of the ESD protection element 300 itself or the connection between the ESD protection element 300 and the leads 106 are such that the ESD protection element 300 breaks or detaches from the leads 106 without substantially bending or breaking the leads 106.

Examples of ESD protection elements 300 that are configured to be electrically disconnected by externally applied mechanical force include wires, capacitors and conducive tape, for example, each of which can be configured according to any of the above-described embodiments. In the case of a wire, the material composition and geometry of the wire can be selected to have a mechanical strength (shear strength) that will fail under weak to moderate force that would not break the leads 106. Additionally, or alternatively, the attachment between the wire and the leads 106 can be designed to fail under weak to moderate force that would not break the leads 106. For example, in the above example wherein the wire comprises solder material that is attached to the leads 106 by laser, the solder connection can be easily broken by weak to moderate force that does not break the leads 106. The same holds true for a capacitor structure. In the case of a conductive tape, the externally applied mechanical force can be a force which peels the adhesive tape away from the leads 106. In each of the above examples, the externally applied mechanical force can be applied after mounting the semiconductor package 100 on the carrier. The mechanical force required to break or remove the ESD protection element 300 can be less than that is required to break the solder connection between the leads 106 and the bond pads 402.

Referring to FIG. 4, the semiconductor package 100 may additionally comprise a shelf 116 that is formed in the encapsulant material of the encapsulant body 108. The shelf 116 forms a planar surface of the encapsulant material that extends transversely (perpendicular or tilted) to the outer sidewalls 114 of the encapsulant body 108. As shown, the shelf 116 may be provided by a protrusion that extends out from one of the outer sidewalls 114 of the encapsulant body 108. Alternatively, the shelf 116 may be provided by an indentation in one of the outer sidewalls 114. In either case, the shelf 116 may be formed as a molded part of the encapsulant body 108 (in the case of a molded package) or may be formed separately after the rectangular portion of the encapsulant body 108 is complete.

The ESD protection element 300 that is provided over the shelf 116 can be any of the above-described embodiments wherein the ESD protection element 300 is configured to be melted by heat or dissolved by chemical solvent. For example, the ESD protection element 300 can be configured as a wire that is responsive to heat or chemical solvent. In any case, the ESD protection element 300 is provided on a portion of the leads 106 such that the ESD protection element 300 is disposed directly over the shelf 116.

Figure 5:
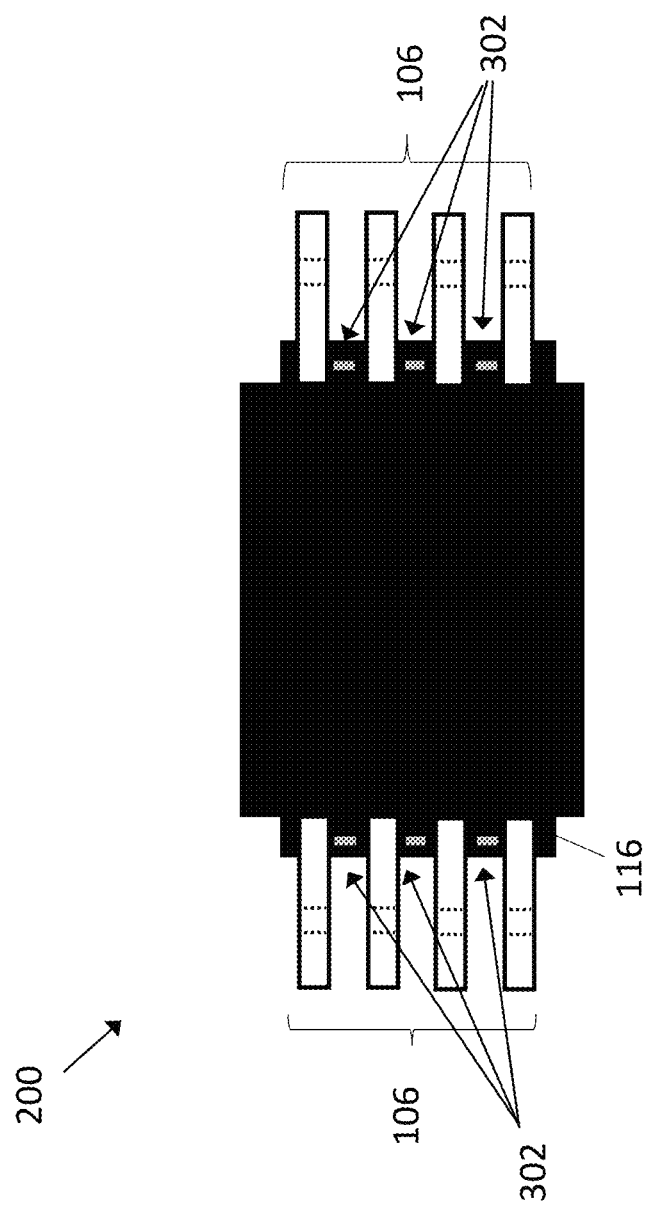
FIG. 5 illustrates a plan view of a semiconductor device after melting or dissolving to the ESD protection device, according to an embodiment.

Referring to FIG. 5, after applying the external stimulus 500, remnants 302 of the ESD protection element 300 accumulate on the shelf 116. That is, the liquified or dissolved material from the ESD protection element 300 that drips or falls downward is retained by the shelf 116. As a result, these remnants 302 are prevented from accumulating in unwanted locations, such as locations on the circuit carrier 400 that may potentially cause an electrical short. In some cases, including the shelf 116 in the semiconductor package 100 may eliminate the need to perform an additional cleaning step to remove any remnants 302 of the ESD protection element 300. According to another embodiment, the shelf 116 may comprise one or more stud-like structures, i.e., raised structures that extend upward from the planar surface of the shelf 116 and are disposed at or near the edge sides of the leads 106. These stud-like structures act as separators, thereby encouraging the liquified or dissolved material to accumulate at locations in between the leads 116 in the manner depicted. In yet another embodiment, the shelf 116 may be formed by a structure that completely surrounds and/or encapsulates the leads 116. This structure may be an enclosed rectangle shape, or circular tubes, or any other enclosed shape. The encapsulant material of this structure may be spaced apart from the leads 116 or may be in contact with the leads 116, e.g., to better receive heat) the walls. The enclosed structure may comprise the the stud-like structures described above.

Referring to FIG. 6, a semiconductor device 200 that comprises a semiconductor package 100 and the ESD protection element 300 is depicted, according to another embodiment. In this embodiment, the semiconductor package 100 is configured as a so-called through-hole style package. Through-hole style packages are designed so that the leads 106 can be inserted into corresponding receptacles in a carrier such as a PCB, thereby forming a mechanical and electrical connection between the two. In an embodiment the semiconductor package 100 is configured as a discrete power transistor package, wherein the leads 106 correspond to the gate, source and drain terminals in the case of a MOSFET or the gate, collector, and emitter terminals in the case on an IGBT.

According to an embodiment, the ESD protection element 300 is configured as a wire that is connected between the control terminals (e.g., gate-source or gate-emitter) and has an electrical resistance that is sufficiently low to protect these terminals. In this arrangement, the ESD protection element 300 can be disconnected by the same action that inserts the semiconductor package 100 into the carrier. In that case, the external stimulus 500 corresponds to the externally applied mechanical force used to insert the leads 106 into the through-hole receptacles. The mechanical strength of the ESD protection element 300 and/or the adhesion between the ESD protection element 300 and the leads 106 can be designed such the wire naturally breaks away with moderate insertion force.

Figure 7:
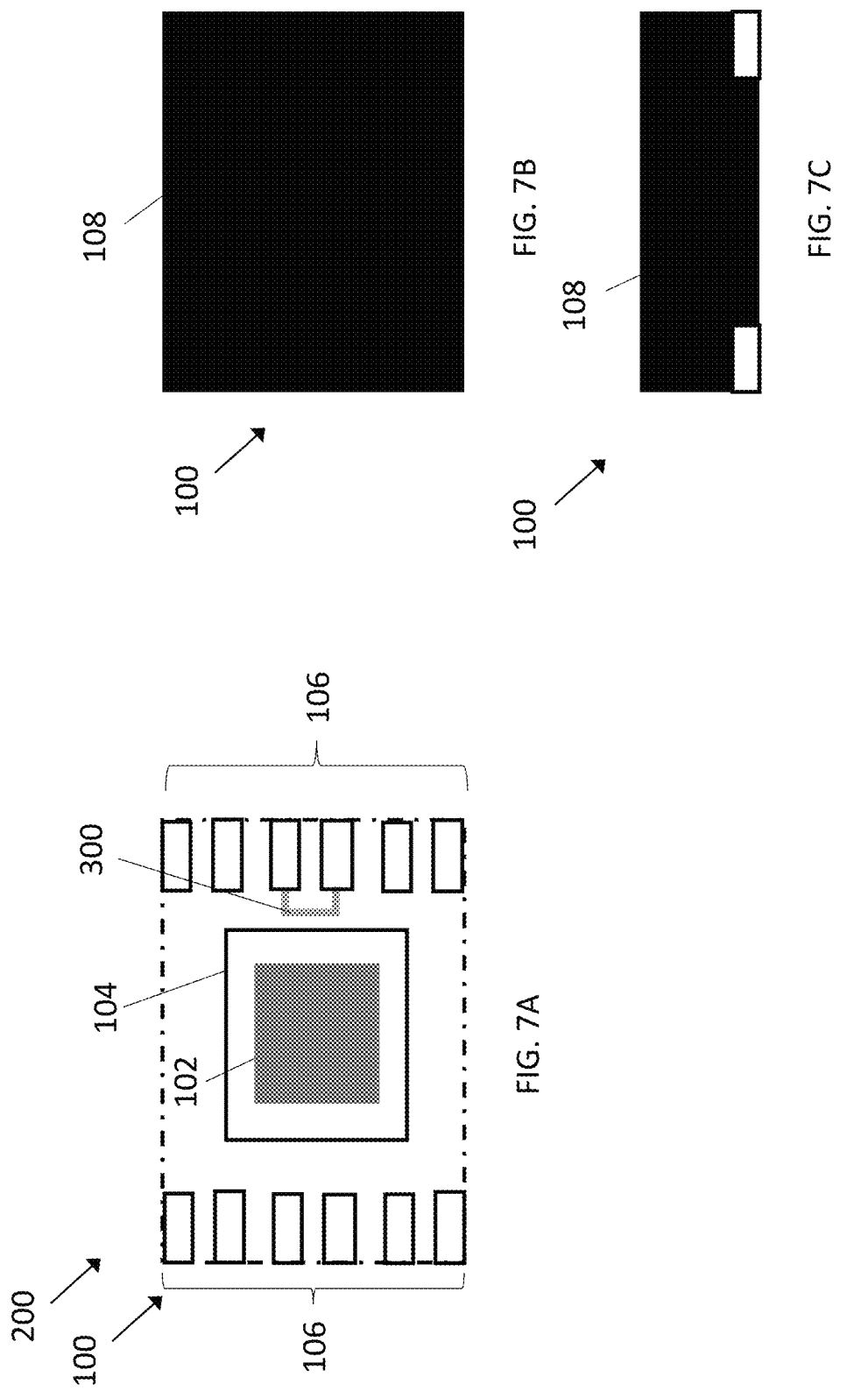
FIG. 7, which includes.

Referring to FIG. 7, a semiconductor device 200 that comprises a semiconductor package 100 and the ESD protection element 300 is depicted, according to another embodiment. In this embodiment, the semiconductor package 100 has a so-called leadless package configuration wherein the exposed surfaces of the leads 106 are planar contact surfaces that are coplanar with the encapsulant body 108. Moreover, the embodiment of FIG. 6 differs from the previous embodiments in that the ESD protection element 300 is internal to the encapsulant body 108. This arrangement may be preferable with a leadless package configuration because there is less exposed contact area to place or attach an ESD protection element 300.

According to an embodiment, the ESD protection element 300 is configured as an electrical fuse. An electrical fuse is a sacrificial device with material properties that cause the device to self-destruct when a sufficient amount of current flows through it. The fuse can be configured to provide a low-resistance electrical connection between the leads 106 in an ESD discharge event according to the above described requirements. That is, the fuse can be designed to withstand typical ESD discharge currents. The fuse can be blown by an externally applied current to the leads 106 that is greater than ESD event conditions. This externally applied current can be applied to the leads 106 after the semiconductor package 100 is mounted on the carrier but before the semiconductor die 102 is operated, e.g., using test equipment.

Disclosed herein is a semiconductor package 100. The semiconductor package 100 may have any semiconductor package type in addition to the specific examples shown in the drawings and discussed above. The term semiconductor package type refers to the physical arrangement of the encapsulant body, leads and carrier or die pad (if present). In the semiconductor industry, a wide variety of semiconductor package types exist to meet application specific needs. Examples of these semiconductor package types include TO (transistor outline) packages, LGA (land grid array) packages, MCM (multi-chip module) packages, LCC (leaded chip carrier) packages, PGA (pin grid array) packages, CFP (ceramic flat pack), QFN (quad flat no-leads) packages, TSOP (thin small-outline package) packages, to name a few.

Disclosed herein is a semiconductor die 102. Generally speaking, the semiconductor die 102 can be any type of device. For example, the semiconductor die 102 can be configured as a discrete device, e.g., diode, transistor, thyristor, etc., or an integrated circuit, e.g., amplifier, driver, controller, etc. The semiconductor die 102 can comprise type IV semiconductor materials, e.g., as silicon, silicon germanium, silicon carbide, etc., and/or type III-V semiconductor materials, e.g., gallium nitride, gallium arsenide, etc. The semiconductor die 102 may be configured as a vertical device that is configured to control a current flowing between a main surface and an opposite facing rear surface, or a lateral device that is configured to control a current flowing parallel to a main surface. The semiconductor die 102 may be a discrete power device. A discrete power device refers to a discrete component that is rated to accommodate voltages of at least 100V and more commonly on the order of 500V or more and/or currents of at least 1 A and more commonly on the order of 10 A or more. Discrete power devices include MOSFETs (Metal Oxide Semiconductor Field Effect Transistors), IGBTs (Insulated Gate Bipolar Transistors), and HEMTs (High Electron Mobility Transistors), for example.

Disclosed herein is an encapsulant body 108 of a semiconductor package 100. The encapsulant body 108 comprises an electrically insulating encapsulant material that seals and protects the semiconductor die 102 and associated electrical connections. Examples of encapsulant materials include ceramics, epoxy materials thermosetting plastics, and composite laminate materials such as FR-4, to name a few. The encapsulant body 108 can be formed according to a wide variety of techniques including molding techniques such as injection molding, transfer molding, etc., and lamination techniques wherein a plurality of layers are successively stacked on top of one another.

Disclosed herein is a carrier 400. The carrier 400 is a device that mechanically supports one or more electronics devices, e.g., semiconductor packages, passive components, heat sinks, etc. The carrier 400 may also provide electrical connections between two or more electronics devices mounted thereon. The carrier 400 may comprise a substrate of electrically insulating material, e.g., ceramic, fiberglass, plastic, composite laminate materials such as FR-4, etc. The carrier 400 may also comprise structured regions of metal, e.g., copper, aluminum, etc., which form conductive tracks, bond pads, heat sink structures, etc. Examples of the carrier 400 include a printed circuit board (PCB), an isolated metal substrate (IMS), a direct copper bonding (DCB) substrate, and an active metal brazed (AMB) substrate.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a singulated semiconductor package comprising an encapsulant body of electrically insulating encapsulant material, a semiconductor die encapsulated by the encapsulant body, and two or more leads that are each electrically connected to the semiconductor die; and
   an ESD protection element that is electrically connected between the two or more leads, and
   wherein the ESD protection element is configured to be electrically disconnected from the two or more leads by an external stimulus applied to the ESD protection element that is non-destructive to the semiconductor package.

2. The semiconductor device of claim 1, wherein the ESD protection element is an electrical resistance or capacitance between at least two of the leads.

3. The semiconductor device of claim 2, wherein the external stimulus comprises any one or more of the following:
   externally applied heat to the semiconductor device;
   externally applied voltage to the two or more leads;
   externally applied mechanical force to the ESD protection element; and
   externally applied solvent to the ESD protection element.

4. The semiconductor device of claim 2, wherein the ESD protection element is external to the encapsulant body.

5. The semiconductor device of claim 4, wherein the two or more leads comprise outer ends that are exposed from the encapsulant body, and wherein the ESD protection element is a wire that is attached to the outer ends of the two or more leads.

6. The semiconductor device of claim 5, wherein the external stimulus comprises a chemical solvent, and wherein the ESD protection element is configured to be electrically disconnected from the two or more leads by dissolving the ESD protection element in the chemical solvent.

7. The semiconductor device of claim 5, wherein the ESD protection element comprises a solder material, wherein the external stimulus comprises externally applied heat, and wherein the ESD protection element is configured to be electrically disconnected from the two or more leads by heating the ESD protection element above a reflow temperature of the solder material.

8. The semiconductor device of claim 4, wherein the encapsulant body comprises:
   an outer sidewall extending between upper and lower surfaces of the encapsulant body; and
   a shelf of the encapsulant material that extends transversely to the outer sidewall, and wherein the ESD protection element is disposed directly over the shelf.

9. The semiconductor device of claim 4, wherein the external stimulus comprises externally applied mechanical force to the ESD protection element, and wherein the ESD protection element is configured to mechanically break or detach from the two or more leads in the presence of the externally applied mechanical force.

10. The semiconductor device of claim 2, wherein the ESD protection element is internal to the encapsulant body.

11. The semiconductor device of claim 10, wherein the external stimulus comprises an externally applied current through the two or more leads, and wherein the ESD protection element comprises an electrical fuse that is configured to self-destruct under the externally applied current.

12. The semiconductor device of claim 1, wherein the semiconductor die comprises a power transistor, and wherein a first one of the two or more leads comprise a gate terminal of the power transistor and a second one of the two or more leads comprise an output terminal of the power transistor.

13. The semiconductor device of claim 1, wherein the ESD protection element is external to the encapsulant body and lies top of an upper surface of the two or more leads.

14. A method of providing a semiconductor device, the method comprising:
   providing a singulated semiconductor package that comprises:

an encapsulant body of electrically insulating encapsulant material;

a semiconductor die encapsulated by the encapsulant body;

two or more leads that are each electrically connected to the semiconductor die; and electrically connecting an ESD protection element between the two or more leads, and wherein the ESD protection element is configured to disconnect from the two or more leads by an external stimulus that is non-destructive to the semiconductor package.

15. The method of claim 14, further comprising:

providing a circuit carrier;

mounting the semiconductor device with the ESD protection element on the circuit carrier; and disconnecting the ESD protection element from the two or more leads by applying the external stimulus before operating the semiconductor die.

16. The method of claim 15, wherein the external stimulus comprises a chemical solvent, and wherein disconnecting the ESD protection element comprises dissolving the ESD protection element by applying the chemical solvent to the ESD protection element.

17. The method of claim 15, wherein the ESD protection element comprises a wire of solder material, wherein the external stimulus comprises externally applied heat to the ESD protection element, and wherein disconnecting the ESD protection element comprises applying the heat to the ESD protection element to heat the ESD protection element above a reflow temperature of the solder material.

18. The method of claim 15, wherein the ESD protection element comprises a wire that is attached to the two or more leads, wherein the encapsulant body comprises an outer sidewall extending between upper and lower surfaces of the encapsulant body and a shelf of the encapsulant material that extends transversely to the outer sidewall, and wherein after applying the external stimulus remnants of the ESD protection element accumulate on the shelf.

19. The method of claim 15, wherein the ESD protection element is external to the encapsulant body, and wherein disconnecting the ESD protection element comprises applying mechanical force that is non-destructive to the leads to detach the ESD protection element from the two or more leads.

20. The method of claim 15, wherein the ESD protection element is internal to the encapsulant body and is configured as a fuse, and wherein disconnecting the ESD protection element comprises applying electrical current to the two or more leads that destroys the ESD protection element.

* * * * *